United States Patent
Arz et al.

(10) Patent No.: US 6,236,207 B1
(45) Date of Patent: May 22, 2001

(54) COIL SYSTEM FOR MAGNETIC RESONANCE SYSTEMS WITH INTEGRATED COOLING UNIT

(75) Inventors: Winfried Arz, Erlangen; Johann Schuster, Oberasbach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/365,906

(22) Filed: Aug. 3, 1999

(30) Foreign Application Priority Data

Aug. 5, 1998 (DE) .............................. 198 35 414

(51) Int. Cl.$^7$ ...................................... G01V 3/00
(52) U.S. Cl. ............................ 324/318; 324/319
(58) Field of Search ..................... 324/318, 319, 324/320, 321, 322, 300, 306, 307, 309

(56) References Cited

U.S. PATENT DOCUMENTS 6,011,394 * 1/2000 Petropoulos et al. ................ 324/318
6,111,412 * 8/2000 Boemmel et al. .................... 324/318

FOREIGN PATENT DOCUMENTS

| 34 45 448 | 7/1985 | (DE) . |
| 195 47 279 | 12/1996 | (DE) . |
| 196 41 319 | 4/1997 | (DE) . |

* cited by examiner

Primary Examiner—Louis Arana
(74) Attorney, Agent, or Firm—Schiff Hardin & Waite

(57) ABSTRACT

A coil system for magnetic resonance systems that surrounds a generally cylindrical examination volume, has coil plies formed by X-gradient coils arranged symmetrically relative to the YZ plane and spaced from one another, and Y-coils arranged symmetrically relative to the XZ plane and spaced from one another, and Z-coils arranged symmetrically relative to the XY plane and spaced from another. An indirect cooling with embedded cooling conduits through which a coolant flows is achieved by cooling conduits integrated in the interspaces of the conductor structure of the coil plies for cooling the conductor structures in a coil ply lying therebelow and/or thereabove.

8 Claims, 1 Drawing Sheet

COIL SYSTEM FOR MAGNETIC RESONANCE SYSTEMS WITH INTEGRATED COOLING UNIT

BACKGROUND OF THE INVENTION

1. Field of the Invention

The present invention is directed to a coil system for magnetic resonance systems which surrounds a substantially cylindrical examination volume, of the type having coil plies formed by the X-gradient coils arranged symmetrically relative to the YZ plane and spaced from one another, Y-coils arranged symmetrically relative to the XZ plane and spaced from one another and Z coils arranged symmetrically relative to the XY plane and spaced from one another, and that has indirect cooling by embedded cooling conduits through which a coolant flows.

2. Description of the Prior Art

In order to guarantee a maximally permitted temperature of a magnetic resonance coil system, it is necessary to eliminate the high dissipated electrical power that occur.

Direct cooling is employed for this purpose, but this is relatively complicated in structure and is often also very complicated and expensive to operate, wherein the electrical conductors of the coil windings are provided with internal cooling channels. Less efficient air cooling is also used, as disclosed, for example, in German OS 195 47 279. Given this indirect cooling, either the cooling conduits (see, for example, German OS 34 45 448 A1) are integrated into the interspaces of the conductor structures of a coil ply, or copper cooling coils are placed in serpentine fashion along the longitudinal direction between individual coil plies, or plastic hoses are helically wound between the coil plies (German OS 196 41 319). The effectiveness of this cooling is limited in both instances, since the heat to be eliminated from the source to the sink, i.e. from the warmest location to the layer of the cooling conduits, must penetrate all layers lying therebetween. In the case of the helically wound plastic hoses, the efficiency is even poorer than that of the flat copper tubes because of the thermal resistance of the plastic hoses.

SUMMARY OF THE INVENTION

An object of the invention is to provide a coil system of the type initially described wherein an improved heat elimination close to the point of heat creation is possible with an indirect cooling.

For achieving this object, in accordance with the invention cooling conduits are integrated into the interspaces of the conductor structure of the coil plies for cooling the conductor structures in a coil ply lying therebelow and/or thereabove.

In known systems, for example, one cooling conductor layer is arranged around a coil system having three coil plies for the X, Y and Z coils arranged concentrically around one another, which allows the heat from the innermost coil ply to proceed to the cooling conductor level only by penetrating the two coil plies arranged thereabove, and thus only an extremely inefficient heat elimination is possible. The inventive cooling system, by contrast utilizes the fact that interspaces into which cooling conduits can be installed are present in the individual coil plies both between the two X and Y gradient coils, preferably fashioned as saddle coils, as well as between the spaced turns of the helical windings of the Z-gradient coils. The cooling conduits in these interspaces between, for example, two saddle coils of one coil ply, thus not only serve the purpose of cooling the conductor structures of this coil ply but also, since they lie directly planarly thereagainst, serve for cooling the conductor structures of the neighboring coil ply lying thereabove or therebelow. A direct cooling of the conductor structures thus is achieved for each and every coil ply, so that other intervening coil plies need not first be penetrated by the heat before it proceeds from the heat source, i.e. the respective conductor structures, to the heat sink, i.e, the cooling tubes.

Inventively, cooling conduits are arranged parallel to the coil axis between the saddle coils for the X and Y directions, with cooling conduits proceeding in the circumferential direction being arranged between the turns of the Z gradient coil.

In order to thereby be able to implement the delivery and removal of the coolant at only one face end in an especially simple way, in an embodiment of the invention a number of cooling conduits parallel to one another respectively proceed in each interspace, these being connected in pairs to a face end. In this way, the inlet opening and the outlet (discharge) opening respectively lie at different face ends. More than one cooling conduit pair can be arranged in a gap between two saddles coil, in which case they are not connected to one another so that only one inlet and one outlet for the coolant is provided. Instead, two such conduits are coupled at one face end and the other ends of these two conduits are fashioned as a directed coolant inlet and return. This requires more inlets and more outlets but has the advantage that the coolant only has to pass through two conduits, and thus cannot become extremely highly heated resulting in an improvement in the heat elimination from the adjacent conductor structure of a neighboring coil ply, due to the increased temperature difference.

The coolant conduits can be composed of metal or plastic and can be fashioned as round or rectangular tubes. A thermally conductive, electrical insulation can also be provided in the case of metallic cooling conduits.

DESCRIPTION OF THE PREFERRED EMBODIMENTS

Figure 1:
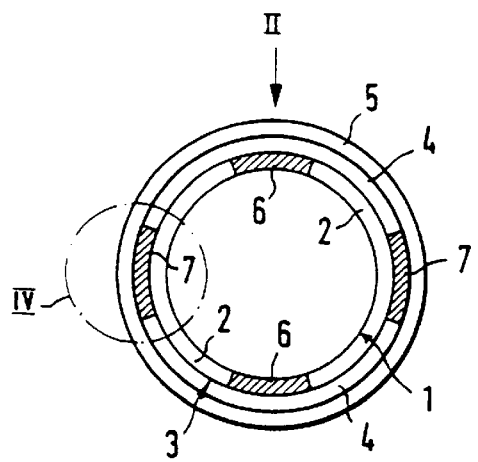
FIG. 1 is a schematic section through a coil system of gradient coils with integrated cooling conduits.
Figure 2:
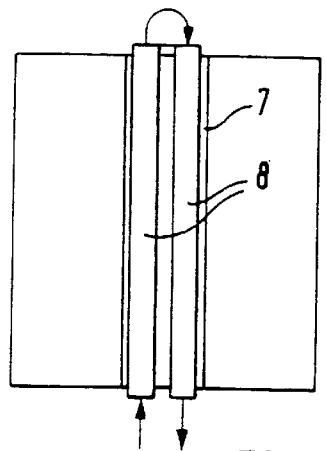
FIG. 2 is a plan view of the coil system of FIG. 1, in the direction of the arrow II.

The coil system schematically shown in FIG. 1 has an inner coil ply 1 having two saddle coils lying diametrically opposite one another, for example the X-gradient coils 2, and a coil ply 3 lying thereabove with, again, two saddle coils (the Y-gradient coils 4) lying diametrically opposite one another but offset by 90° relative to the X-gradient coils 2, and a ply 5 lying concentrically thereabove. This ply 5 can be the Z-gradient coil or a conventional cooling layer for indirect cooling, i.e., for example, cooling conduits through which water flows.

Inventively, cooling coils through which a coolant flows, preferably water, are installed in the interspaces 6 and 7 of the conductor structures of the coil plies 1 and 3, i.e. respectively between the X and Y gradient coils 2 and 4, as shown in detail in FIGS. 2 through 5. Two cooling conduits 8 and 9 in the exemplary embodiment of FIG. 2 and four cooling conduits 8 and 9 in the exemplary embodiment of FIG. 3 disposed in the interspace 7 and a like number in the interspace 6. The conduits can be round or rectangular but the radial height of these tubes, of course, cannot be any greater than the radial thickness of the respective coil ply into whose conductor structure interspace 6, 7 the cooling conduits are placed. The cooling conduits are connected to one another at their ends in pairs, so that two conduits form a separate cooling circulation path, i.e. they are independently connected to the external cooling circulation path, and the coolant does not successively flow through, for example, all four cooling conduits 9 in FIG. 3. As a result, they would be heated to a substantially greater extent and, consequently, could not eliminate heat from the conductor structures of the coil plies lying respectively thereabove or therebelow to the same great extent as given the illustrated exemplary embodiments.

The cooling conduits in the interspaces 6 of the X-gradient coils 2 of the innermost coil ply serve for eliminating heat from the conductor structures of the surrounding coil ply 3, i.e, from the Y-gradient coils 4, whereas the cooling conduits in the interspaces 7 of this coil ply 3 lying farther toward the outside lie directly against the X-gradient coils 2 and are capable of accomplishing an enhanced heat elimination.

Figure 3:
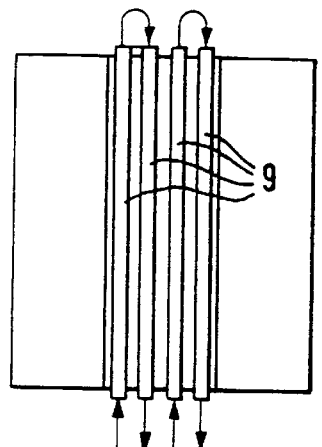
FIG. 3 is a plan view corresponding to FIG. 2 for a structure with larger interspace between the conductor structures and an increased number of cooling conduits.
Figure 4:
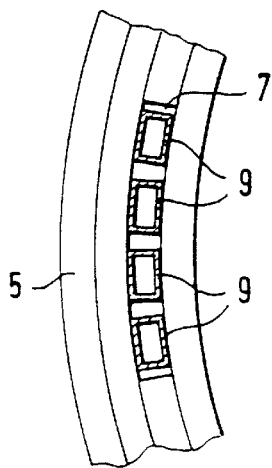
FIG. 4 is an enlarged view of the excerpt IV in FIG. 1, partly in section, wherein metallic rectangular tubes are installed as cooling conduits in the interspaces.
Figure 5:
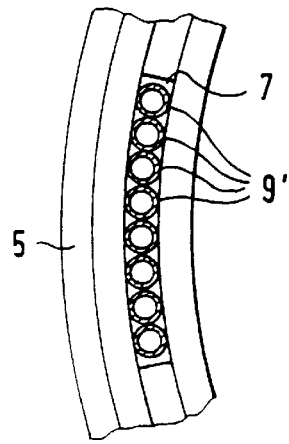
FIG. 5 is an enlarged section corresponding to FIG. 4, wherein the cooling conduits are round plastic tubes.

FIG. 4 shows a partial section IV in FIG. 1 with four cooling coils according to FIG. 3 with the cooling coils as rectangular tubes. FIG. 5 shows a section corresponding to FIG. 4 given an embodiment wherein cooling conduits 9' parallel to one another and proceeding axially parallel to the coil system are accommodated in an interspace 7, these being preferably fashioned here as round conduits composed of plastic.

The ply 5 can be the coil ply for the Z-gradient coil. In this case, cooling conduits wound in the circumferential direction are integrated between the generally helically proceeding conductors of this Z-gradient coil, these preferably serving the purpose of cooling the Y-gradient coils 4 the coil ply 3 lying therebelow. As warranted, however, the ply 5 can also be an indirect cooling ply merely having cooling coils embedded therein, in which case the coil ply for the Z-gradient coil is arranged at the outside on this ply 5. Given this arrangement, the provision of the integrated coiling conduits in the interspaces between the conductor structure of the helical Z-gradient coil is not required since, of course, the Z-coil is then directly cooled by the cooling arrangement in the ply 5 lying therebelow.

Although other modifications and changes may be suggested by those skilled in the art, it is the intention of the inventors to embody within the patent warranted hereon all changes and modifications as reasonably and properly come within the scope of their contribution to the art.

We claim as our invention:

1. A coil system which surrounds a substantially cylindrical examination volume in a magnetic resonance apparatus, said coil system comprising:

an innermost coil ply, an intermediate coil ply at least partly surrounding said innermost coil ply, and an outermost coil ply at least partly surrounding said intermediate coil ply;

at least one of said plies having a conductor structure within said one of said coil plies, said conductor structure having at least one interspace therein; and a conduit in which coolant flows disposed in said interspace for cooling at least one of said coil plies adjacent to said coil ply with said interspace.

2. A coil system as claimed in claim 1 wherein said innermost coil ply comprises X-gradient coils formed by saddle coils and wherein said intermediate coil ply comprises Y-gradient coils formed by saddle coils, said saddle coils having longitudinal axes and said conduit being disposed in said interspace parallel to said axes.

3. A coil system as claimed in claim 1 comprising a plurality of cooling conduits parallel to each other disposed in each interface, said plurality of cooling conduits being connected in pairs at an end face of said coil system.

4. A coil system as claimed in claim 1 wherein said cooling conduit comprises a tube of a material selected from the group consisting metal and plastic.

5. A coil system as claimed in claim 4 wherein said conduit has a rectangular cross-section.

6. A coil system as claimed in claim 1 wherein said conduit comprises an electrically insulated metallic tube.

7. A coil system as claimed in claim 1 wherein said one of said coil plies having said conductor structure with said interspace comprises a coil ply containing radiant coils formed by saddle coils, said saddle coils being spaced from each other and forming said interspace between said saddle coils.

8. A coil system as claimed in claim 1 wherein said one of said plies having said conductor structure with said interspace contains a Z-gradient coil having a plurality of turns proceeding in a circumferential direction, said turns being spaced from each other and forming said interspace between said turns.

* * * * *